United States Patent [19]

Tihanyi

[11] Patent Number: 4,737,667
[45] Date of Patent: Apr. 12, 1988

[54] DRIVING CIRCUITRY FOR A MOSFET HAVING A SOURCE LOAD

[75] Inventor: Jenöe Tihanyi, Munich, Fed. Rep. of Germany

[73] Assignee: Siemens Aktiengesellschaft, Berlin and Munich, Fed. Rep. of Germany

[21] Appl. No.: 21,867

[22] Filed: Mar. 4, 1987

[30] Foreign Application Priority Data

Mar. 11, 1986 [DE] Fed. Rep. of Germany ....... 3608023

[51] Int. Cl.$^4$ ................. H03K 19/094; H03K 17/687; H03K 3/26; H01L 27/02
[52] U.S. Cl. .................... 307/482; 307/270; 307/578; 307/579; 307/451; 307/303; 357/51
[58] Field of Search ............... 307/482, 578, 270, 585, 307/579, 451, 303.2; 357/43, 46, 51

[56] References Cited

U.S. PATENT DOCUMENTS

| | | | |
|---|---|---|---|
| 3,271,640 | 9/1966 | Moore | 357/23.12 |
| 3,667,115 | 6/1972 | Barson et al. | 437/150 |
| 4,616,143 | 10/1986 | Miyamoto | 307/482 |
| 4,677,314 | 6/1987 | Shirato et al. | 307/270 |
| 4,698,526 | 10/1987 | Allan | 307/270 |

FOREIGN PATENT DOCUMENTS 0133642 6/1984 European Pat. Off. .
2547220 5/1977 Fed. Rep. of Germany .
56197268 6/1983 Japan .
57208295 6/1984 Japan .

OTHER PUBLICATIONS

European Search Report Dated 5.12.86.
Siemens Components Article, 2 pages.

Primary Examiner—Stanley D. Miller
Assistant Examiner—Trong Quang Phan
Attorney, Agent, or Firm—John Francis Moran

[57] ABSTRACT

In a circuit for driving a MOSFET connected to a load on the source terminal, the MOSFET is configurated as a source follower that is driven by a voltage doubling circuit including two diodes (D1, D2) serially connected together. The drain terminal of the MOSFET is connected to the operating voltage source and its gate terminal to the voltage doubling circuit which includes a capacitor (C). One terminal of the capacitor is connected between the diodes and its other terminal is supplied with a clocked dc voltage. The first diode (D2) is formed by a lateral MOSFET, whose gate electrode is connected with the drain zone. The second diode is formed by a vertical bipolar transistor with low current gain. A resistor is located between the emitter zone and the source zone. This particular circuit geometry is readily suitable for realization in integrated form.

4 Claims, 1 Drawing Sheet

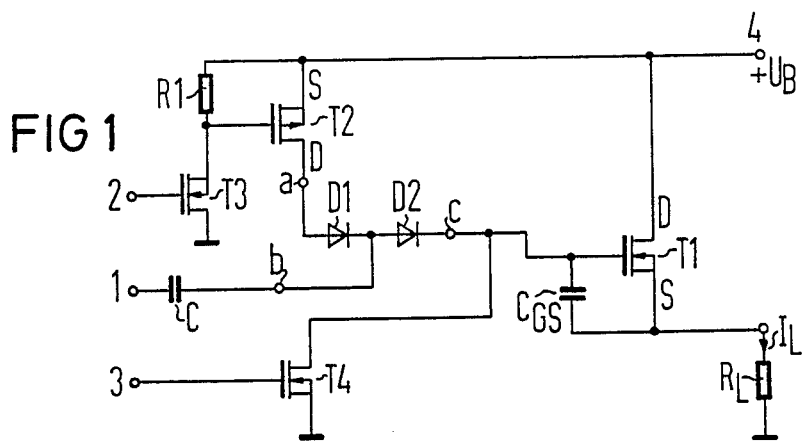
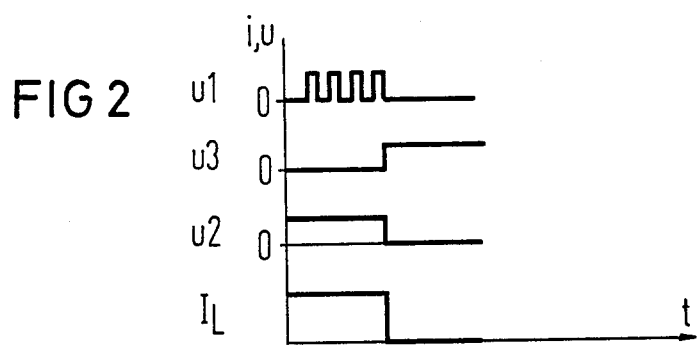
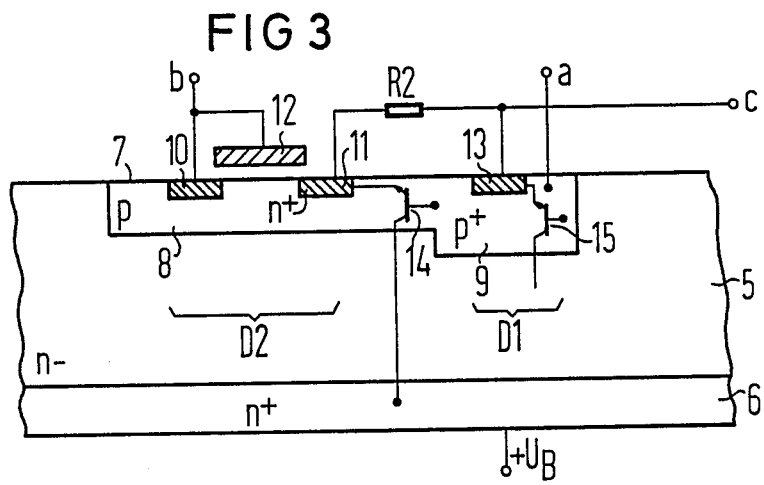

DRIVING CIRCUITRY FOR A MOSFET HAVING A SOURCE LOAD

BACKGROUND OF THE INVENTION

This invention relates to a circuit arrangement for driving a MOSFET coupled to one terminal of a load at its source terminal with the other terminal of the load connected to ground potential.

A conventional circuit arrangement of this type is described, for example, in the journal entitled "Siemens Components" 22 (1984), supplement 4, pp. 169. It utilizes the fact that the source potential of a MOSFET having a source load (source follower configuration) changes when being switched on. If the MOSFET is to remain switched on, then the gate potential must be maintained higher than the source potential by at least the turn on threshold voltage. When the MOSFET is fully conductive, the gate potential therefore has to lie above the drain potential by the turn on threshold voltage. In conventional circuits, it is possible to maintain a source follower in a conducting state even when no higher voltage than the drain source voltage source (operating voltage) is available. These circuits utilize a voltage doubling circuit in which a capacitor is charged to the operating voltage by one of the diodes. Additionally, a clocked d-c voltage is applied to the capacitor which charges the capacitor to a voltage which is higher than the operating voltage. The capacitor discharges through the second diode into the gate-source capacitance of the MOSFET and drives it to become conductive.

SUMMARY OF THE INVENTION

It is an object of the present invention to provide a circuit arrangement of this type in such a way that it can be readily integrated on a semiconductor chip.

A related object of the invention is to provide an integrated circuit for the serially connected diodes.

According to a specific arrangement of the two diodes, an integratable construction design is provided.

In an illustrative embodiment of the invention, this and other objects are achieved by an arrangement including the drain terminal of the MOSFET being connected to an output terminal, the output terminal is connected to one pole of an operating voltage source and between the gate connection of the MOSFET and ground lies a switch. In the gate line of the MOSFET, two diodes are connected in series wherein a central tap is included connected to a first terminal of a capacitor while the other terminal is connected with a first input terminal to which receives a clocked signal swinging between two d-c voltage levels. The series circuit of the diodes is connected through the drain-source path of a second MOSFET to the output terminal of the circuit. The second MOSFET is of a channel type opposite to that of the first MOSFET and has its source terminal connected to the output terminal. A capacitor is connected between source terminal and the gate terminal of the second MOSFET. Between the gate terminal of the second MOSFET and ground potential the source-drain circuit of a third MOSFET is located. The gate terminal of the third MOSFET is connected to a second input terminal. The switch takes the form of a fourth MOSFET of a channel type corresponding to the first MOSFET. The gate connection of the fourth MOSFET serves as a third input terminal. To the second and third input terminals, inversely related logic signals levels are applied.

BRIEF DESCRIPTION OF THE DRAWING

Features of the invention and additional objects of the invention will be more readily appreciated and better understood by reference to the following detailed description which should be considered in conjunction with the drawing.

FIG. 1 is a circuit diagram of an arrangement according to the invention.

FIG. 2 is a waveform diagram of the voltage at the three input terminals and the output load current.

FIG. 3 is a preferred integrated circuit arrangement for the serial diodes utilized in the circuit of FIG. 1.

DETAILED DESCRIPTION

In FIG. 1, MOSFET T1 is configured as a source follower within the overall circuit arrangement. Load $R_L$ is connected to the source terminal of MOSFET T1 and is switched on or off. A series current path via the drain-source circuit of MOSFET T1 is provided between a terminal 4 and ground at an operating voltage $+U_B$. The transistor T1 has a gate-source capacitance of $C_{GS}$. The gate terminal of T1 is connected through a series circuit of two diodes D1, D2 and through the source-drain section of a second MOSFET T2 with the terminal 4 of the circuit. The second MOSFET T2 is of a channel type opposite to that of the first MOSFET T1. In the illustrative embodiment of the invention, T1 has an n-type channel while T2 has a p-type channel. The source terminal of transistor T2 is connected directly to the $+U_B$ supply via terminal 4.

Between the source terminal and the gate terminal of the transistor T2 a resistor R1 is connected. The gate terminal of T2 is connected via another MOSFET T3 to ground potential. MOSFET T3 is of the same MOSFET channel type as T1. The drain terminal of MOFSET T3 is connected to ground potential.

The series circuit of the two diodes D1 and D2 is provided with a central tap coupled to one terminal of a capacitor C. The other terminal of the capacitor C is connected to an input terminal 1.

The gate terminal of the transistor T1 is connected with the source-drain section of a further MOSFET T4 whose source terminal is at ground potential. The gate terminal of this transistor is connected with an input terminal 3.

To operate or turn on the transistor T1 in a switching mode, the voltages designated u1, u2, and u3 in FIG. 2 are applied to the input terminals. In FIG. 2, waveform u1 is a clocked signal between two d-c voltage levels wherein the difference between the two voltage levels may correspond, for example, to the operating voltage. Voltages u2 and u3, for example, may be output signals of a logic circuit with respective logic low and high voltage levels of L=0 V and H=5 V. These signal levels are inversely related with respect to each other.

While the clocking signal is applied to the input terminal 1, the low voltage level of u3 is applied to input terminal 3 and the voltage u2 at the terminal 2 corresponds to a high(H) level. Accordingly, the transistor T4 is blocked or off and the transistor T3 on or conducting. Under these circumstances, current flows from the terminal 4 through the transistor T2, through the diode D1 into the capacitor C. Thereby it is charged to the operating voltage $+U_B$. The capacitor C discharges continuously into the gate-source capacitor $C_{GS}$ of MOSFET T1 and drives it conducting continuously. Accordingly, a load current $I_L$ can flow from the terminal $U_B$ to ground.

In order to switch the transistor T1 off, the voltage at the input terminal 1 is maintained at zero, voltage u3 goes high(H) and the voltage U2 goes low(L). Thus, the MOSFET T4 is switched on and discharges the capacitor $C_{GS}$. Simultaneously, the MOSFET T2 is blocked or off so that a recharging of the capacitor C does not take place.

The circuit arrangement according to FIG. 1 can be integrated in a simple way whereby the integration of the MOSFETs can be provided using techniques known to those skilled in integrated circuit technology. A separate representation of the integrated MOSFET as well as the integrated capacitor and resistor is therefore omitted. In FIG. 3, only the integrated arrangement of the diodes D1 and D2 is shown.

The diodes are integrated into a semiconductor body whose substrate corresponds to a first zone 5. Adjacent to one side of zone 5 is a more heavily doped zone 6 connected to the operating voltage $+U_B$. Into the first zone 5, a zone 7 of opposite transmission type is planarly embedded. This zone includes two portions or sections 8 and 9. Section 9 is doped more heavily (p+) then section 8(p) and thicker than the latter. Into section 8, a drain zone 10 and a source zone 11 are embedded. Between these zones, a portion of section 8 extends to the surface of the semiconductor and is there covered by a gate electrode 12. This portion of zone 8 forms the gate zone of a lateral MOSFET. The gate electrode 12 is connected with the drain zone 10 and with a terminal b. Into portion of zone 9, a zone 13 is embedded which serves as the cathode of the diode D1. The anode zone is formed by zone 9 which is provided with a terminal a. The source zone 11 and the cathode 13 of the diode D1 are connected with each other through a resistor R2 and with a terminal c. The letter labeling of the terminals corresponds to those shown in FIG. 2.

The diode D2 is formed by the lateral MOSFET while the diode D1 is formed by the zone 13 and section 9. When a voltage is applied to the terminal b of the lateral MOSFET is conducting and current flows from zone 10 through the intermediate portion 8 into zone 11 to the terminal c. When a voltage is applied to the terminal a, current flows into portion 9 and through zone 13 to the terminal c.

Zone 13 forms with section 9 and zone 5 a parasitic bipolar transistor 15 while zone 11 forms with section 8 and zone 5 a parasitic bipolar transistor 14. The effect of the parasitic bipolar transistor 15 is substantially eliminated through the high doping concentrating of 9 and through its greater thickness as compared to section 8 resulting in a relatively small current amplification ($\beta = 10$–$50$). The effect of the parasitic bipolar transistor 14 is limited by the resistor R2. In principle, however, it is here possible also to produce section 8 with greater thickness, with respect to the amount of doping, however, limits are set because a low starting voltage of the lateral MOSFET is desirable. It is, however, also possible, to fabricate sections 8 and 9 as zone which are separated from each other.

There has thus been shown and described a novel circuit arrangement including a load terminal coupled to the source terminal of a MOSFET which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

I claim:

1. A circuit arrangement for driving a MOSFET having a load connected between its source terminal and ground potential, the circuit arrangement comprising:
   (a) an output terminal connected to a drain terminal of the MOSFET;
   (b) the output terminal connected to one polarity of a voltage source;
   (c) a switch connected between a gate terminal of the MOSFET and ground potential;
   (d) two diodes serially connected together and to the gate of the MOSFET;
   (e) a central tap of the serially connected diodes and one terminal of a capacitor being connected together
   (f) a clocking d-c voltage applied to the other terminal of the capacitor;
   (g) a second MOSFET having its drain-source current path connected to the series circuit of the two diodes;
   (h) the second MOSFET being of a channel type opposite to that of the first MOSFET and its source terminal being connected to the output terminal;
   (i) a resistor connected between the source terminal and the gate terminal of the second MOSFET;
   (j) a third MOSFET of channel type corresponding to the first MOSFET being connected between the gate terminal of the second MOSFET and ground potential;
   (k) a second input terminal connected to the gate terminal of the third MOSFET;
   (l) a fourth MOSFET of channel type corresponding to the first MOSFET;
   (m) a third input terminal connected to the gate terminal of the fourth MOSFET; and
   (n) inversely related logic signals being applied to the second and third input terminals.

2. The circuit arrangement of claim 1, wherein said two diodes are formed in an integrated circuit having a semiconductor substrate; a lateral MOSFET with a source zone, a drain zone, and a gate zone being formed in the integrated circuit; a gate electrode connected to said drain zone and covering said gate zone; a vertical bipolar transistor with an emitter zone, a base zone, a collector zone being formed in the substrate of the integrated circuit having a current amplification in the range of 10 to 50; a resistor connected between said source zone and said emitter zone; and a terminal being connected to said base zone.

3. A circuit arrangement in accordance with claim 2 wherein said gate zone and said base zone form a single continuous zone in the integrated circuit.

4. A circuit arrangement in accordance with claim 3 wherein the base zone is thicker and more heavily doped than the gate zone.

* * * * *